United States Patent
Lin et al.

(10) Patent No.: US 8,545,053 B2
(45) Date of Patent: Oct. 1, 2013

(54) LIGHT DEVICE WITH MULTIPLE LED LIGHT SOURCES

(75) Inventors: Pao-Ting Lin, Hsinchu (TW); San-Bao Lin, Chungli (TW)

(73) Assignee: ASDA Technology Co., Ltd., Hsinchu (TW)

( * ) Notice: Subject to any disclaimer, the term of this patent is extended or adjusted under 35 U.S.C. 154(b) by 384 days.

(21) Appl. No.: 12/964,361

(22) Filed: Dec. 9, 2010

(65) Prior Publication Data

US 2011/0134637 A1    Jun. 9, 2011

(30) Foreign Application Priority Data

Dec. 9, 2009   (TW) ............................... 98142104 A
Mar. 16, 2010  (TW) ............................... 99107642 A

(51) Int. Cl.
*F21S 4/00* (2006.01)
*F21V 21/00* (2006.01)

(52) U.S. Cl.
USPC ................. 362/249.02; 362/227; 362/235

(58) Field of Classification Search
USPC ............... 362/235, 249.02, 227, 236, 237; 257/88, 98, 99, 100; 313/500
See application file for complete search history.

(56) References Cited

U.S. PATENT DOCUMENTS

| | | | |
|---|---|---|---|
| 2008/0012036 A1* | 1/2008 | Loh et al. | 257/99 |
| 2009/0101921 A1* | 4/2009 | Lai | 257/88 |
| 2009/0109668 A1* | 4/2009 | Isobe | 362/231 |
| 2009/0278151 A1* | 11/2009 | Kim | 257/98 |
| 2010/0254117 A1* | 10/2010 | Hsu et al. | 362/97.1 |
| 2011/0163688 A1* | 7/2011 | Yan et al. | 315/294 |
| 2011/0188248 A1* | 8/2011 | Chang | 362/249.02 |
| 2012/0068604 A1* | 3/2012 | Hasnain et al. | 315/113 |
| 2012/0068621 A1* | 3/2012 | Ward | 315/294 |

FOREIGN PATENT DOCUMENTS

CN    201336320 Y    10/2009

* cited by examiner

*Primary Examiner* — Mariceli Santiago
*Assistant Examiner* — Glenn Zimmerman
(74) *Attorney, Agent, or Firm* — Muncy, Geissler, Olds & Lowe, PLLC

(57) ABSTRACT

A light device with multiple LED light sources includes a metal conductive plate and a plurality of LED elements. The metal conductive plate consists of plural plate members, and a slot is defined between every two adjacent plate members for physically separating the two adjacent plate members. Each LED element is electrically connected to the plate members disposed at two sides of the slot. The LED elements are electrically connected in series or in parallel through the plate members disposed at the two sides of the slot.

17 Claims, 7 Drawing Sheets

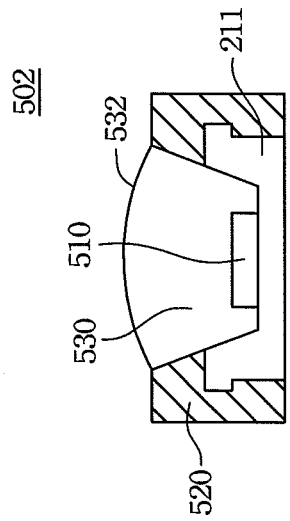
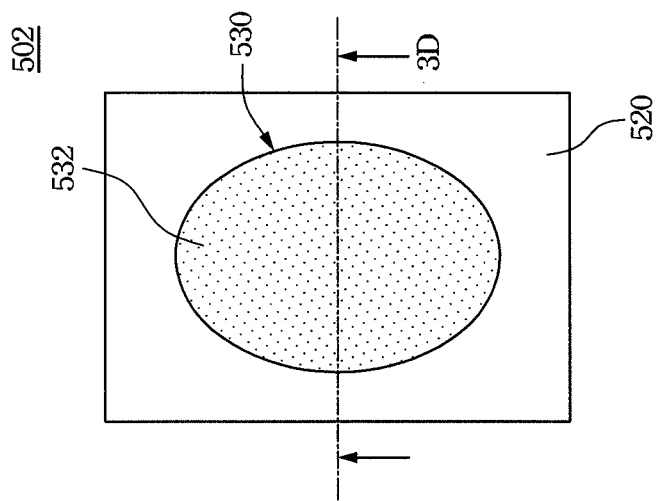
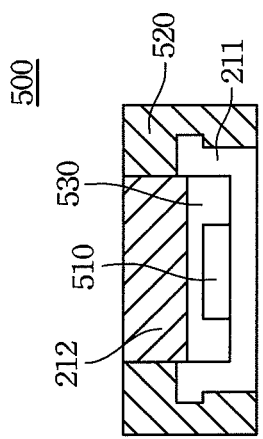
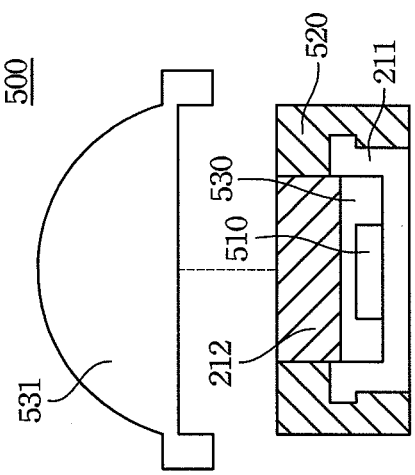

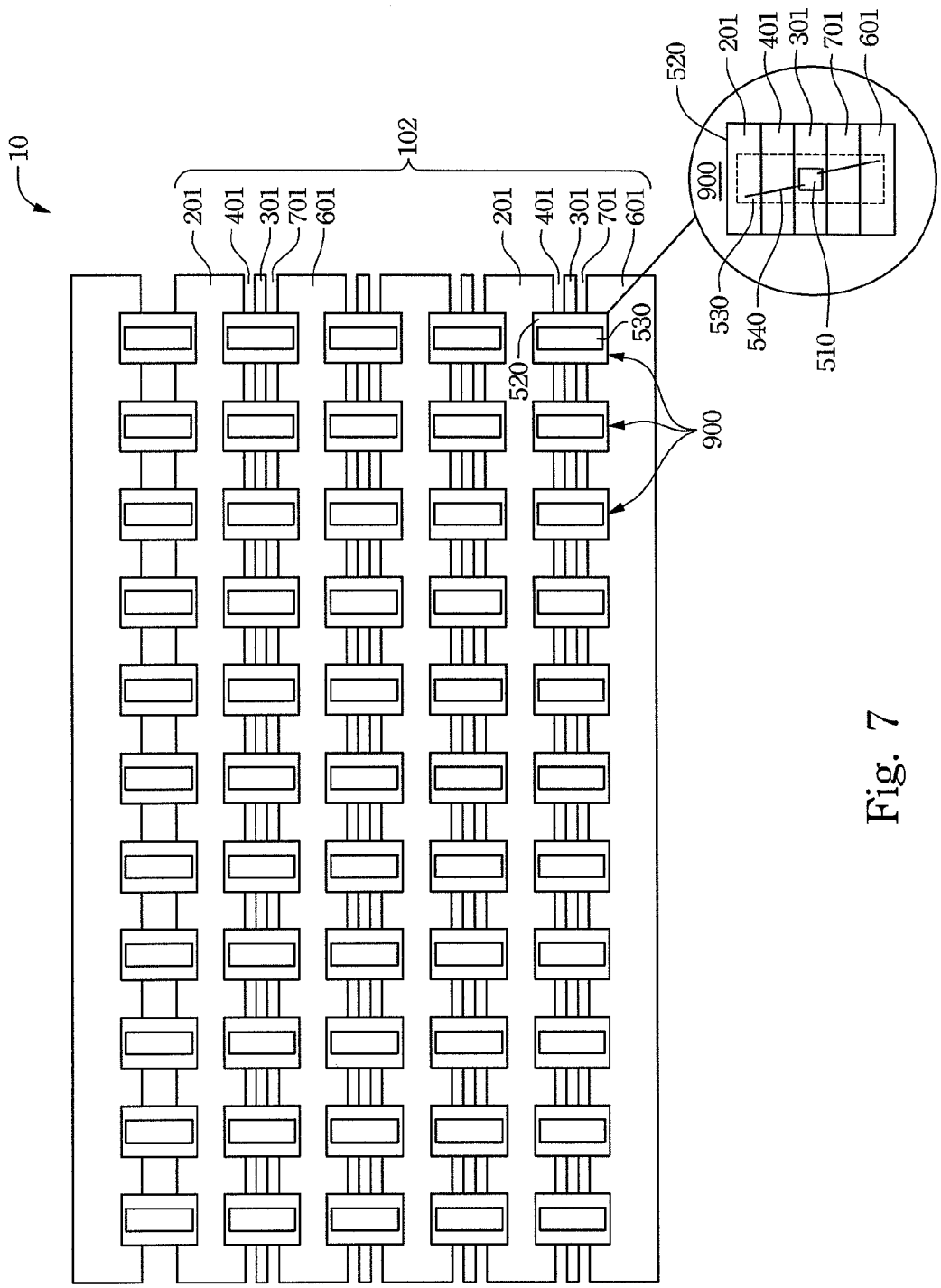

LIGHT DEVICE WITH MULTIPLE LED LIGHT SOURCES

RELATED APPLICATIONS

This application claims priority to Taiwan Application Serial Number 98142104, filed Dec. 9, 2009, and 99107642, filed Mar. 16, 2010, which are herein incorporated by reference.

BACKGROUND

1. Technical Field

The present invention relates to a LED lighting device, especially to a light device with multiple LED light sources.

2. Description of Related Art

At present, light emitting diodes can be categorized to a top-view type and a side-view type, and have advantages of high efficiency, long service life, more durable in use. A conventional LED packaging procedure is as followings: base molding, chip fastening, wire bonding, adhesive sealing and pin trimming; and after the pin trimming procedure, an operation of bending pins has to be performed, so as to finish the conventional LED package. The bended pins of LED increases the contact areas for applying solder pastes in order to be firmly fixed on an electric circuit board.

Referring to FIG. 1, which is a structural schematic view showing a conventional top-view LED module. A conventional top-view LED module 5 includes a package base 50 and two conductive pins 51. The two conductive pins 51 respectively protrude out of the package base 50 and are bended from outer ends of two corresponding lateral sides of the package base 50 towards a surface of the package base 50 facing an electric circuit board 6.

However, the LED has to be performed with the plural mentioned procedures to be a LED package product, so that the production cost and manufacturing time are inevitably increased. Also, the LED module can only be used through welding its conductive pins 50 onto the electric circuit board 6, therefore, it is not able to be used as an individual light device. Moreover, heat dissipation plates or fins have to be installed to the LED module for dissipating the heat.

So an object of controlling the mentioned production cost and manufacturing time and forming an individual light device without the installation of electric circuit board is desired to be achieved.

SUMMARY

The present invention discloses a light device with multiple LED (light emitting diode) light sources in which a plurality of LED elements are directly packaged on a metal plate which is served as an electric conductive media for the LED elements through the electric conduction property of the metal plate.

Meanwhile, the electrical connection between the LED elements can be arranged as being in series or in parallel through altering the shape of the metal plate, such that the light device with multiple LED light sources is unnecessary to be installed on a circuit board and can be directly used. Accordingly, the cost of circuit board can be saved by the present invention, and cost which the LED elements being installed on the circuit board can also be saved.

The present invention discloses a light device with multiple LED light sources, which utilizes a property of a metal plate having a large surface area, for increasing the heat dissipation effect for LED elements.

The present invention discloses a light device with multiple LED light sources, capable of forming a package base for LED elements all at once, so the present invention is different from the conventional art that needs to cut and then get each LED element one by one.

The disclosed light device with multiple LED light sources, according one embodiment of the present invention, is suitably to be used in a fashion of directly illuminating after being electrically charged, and comprises a metal conductive plate and a plurality of first LED elements. The metal conductive plate consists of several plate members including a first plate member and a second plate member. A first slot is defined between the second plate member and the first plate member. The first plate member includes a plurality of first chip racks arranged across the first plate member and extended towards the first slot, and electrically connected with each other through the first plate member. The second plate member has a plurality of first connection portions arranged across the second plate member and extended towards the first slot, and electrically connected with each other through the second plate member, and respectively corresponding to the first chip racks. The first LED elements are respectively installed on the first slot, and each first LED element is electrically connected to the first plate member and the second plate member, wherein the first LED elements are electrically connected with each other through the first plate member and the second plate member.

The light device with multiple LED light sources, in another embodiment according to the present invention, comprises a metal conductive plate and a plurality of LED elements. The metal conductive plate includes at least two plate members. A first plate member is installed with a plurality of first chip racks electrically connected with each other through the first plate member. A first slot is defined between a second plate member and the first plate member. The second plate member is installed with a plurality of first connection portions respectively corresponding to the first chip racks and electrically connected with each other through the second plate member. The LED elements are respectively arranged on the first slot, each LED element includes a LED chip, a bottom package portion and a top package portion. The LED chips are respectively disposed on one of the first chip racks, and electrically connected to the first chip racks and the first connection portions. The bottom package portion combines the first chip rack and the first connection portion. The upper package portion covers the LED chip.

The present invention discloses a light device with multiple LED light sources in which LED elements being equipped with independent heat dissipation paths and independent electricity supply paths through separating the convey paths of electric and thermal energy, for providing more stable electric energy.

The light device with multiple LED light sources comprises a metal single-layer conductive plate and a plurality of LED elements. The metal single-layer conductive plate includes a first plate member, a second plate member and a third plate member. The second plate member is disposed between the first plate member and the third plate member, and a first slot is defined between the second plate member and the first plate member, a second slot is defined between the second plate member and the third plate member. The first slot is served to separate the physical contact between the first plate member and the second plate member. The second slot is served to separate the physical contact between the second plate member and the third plate member. The LED elements are respectively installed on the second plate member and are electrically insulated to the second plate member, and heat is dissipated from the second plate member, and the LED elements are all electrically connected to the first plate member and the third plate member. The LED elements are electrically connected with each other through the first plate member and the third plate member.

The present invention discloses a light device with multiple LED light sources, in which lenses being installed thereon for obtaining more light output angles so as to expand the light output range, and the illumination quality is therefore enhanced.

The light device with multiple LED light sources comprises a metal single-layer conductive plate and a plurality of LED elements. The metal single-layer conductive plate includes plural plate members. A slot is defined between every two adjacent plate members, and each slot is served to separate the physical contact between the adjacent plate members. Each LED element crosses one of the slots and is fastened on the plate members defined at two lateral sides of the mentioned slot, and is electrically connected with each other through the plate members defined at the two lateral sides of the slot, wherein each LED element respectively has a dome-shaped lens.

As such, the present invention utilizes a metal conductive plate as the base material to alert the electrical connection in series or in parallel, so as to be served as a light device with multiple LED light sources capable of directly illuminating after being electrically charged.

BRIEF DESCRIPTION OF THE DRAWINGS

FIG. 3A is a cross sectional view taken alone line 3A-3A of FIG. 2.

FIG. 3B is a schematic cross sectional vdiew showing the light device with multiple LED light sources according to another embodiment of the present invention.

FIG. 3C is a schematic front view showing single LED element of the light device with multiple LED light sources according still one another embodiment of the present invention.

FIG. 3D is a cross sectional view taken along line 3D-3D of FIG. 3C.

FIG. 7 is a schematic view showing the light device with multiple LED light sources according to still one another embodiment of the present invention.

DESCRIPTION OF THE PREFERRED EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Different from the conventional LED package module in which each component has to be individually removed then welded on a circuit board for forming a light device capable of directly illuminating after being electrically charged, the present invention provides a light device with multiple LED light units, which comprises a metal conductive plate and a plurality of LED elements.

The LED elements are directly and respectively installed on the metal conductive plate, wherein the metal conductive plate can be formed as plural plate members after being cut, and a slot is defined between every two adjacent plate members for separating the physical contact between the two adjacent plate members. The LED elements are respectively installed on the slots, and physically in contact with the plate members defined at two lateral sides of the slot, and are individually and electrically connected to the plate members defined at the two lateral sides of the slot, such that the LED elements can be electrically connected through the two plate members.

Because of the electric conduction property of the metal plate, the metal plate is served as a media for the electrical connection between the LED elements, such that the electrical conduction between the LED elements can be in series or in parallel through a change of the appearance of the metal conductive plate by cutting the metal plate.

As such, the light device with multiple LED light sources is not necessary to be installed on a circuit board so as to directly perform an illumination operation. Moreover, because the metal plate substantially has large surface areas thereon, the large surface areas can be pre-designed as a larger heat dissipation area for increasing the heat dissipation effect for the LED elements.

Figure 1:
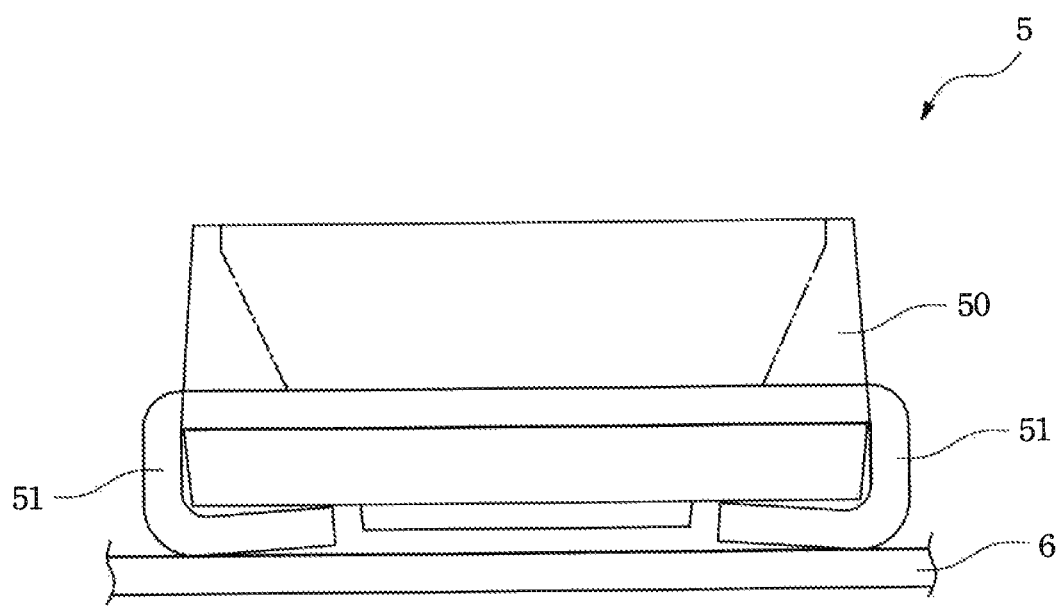
FIG. 1 is a schematic structural view showing a conventional top-view LED module.
Figure 2:
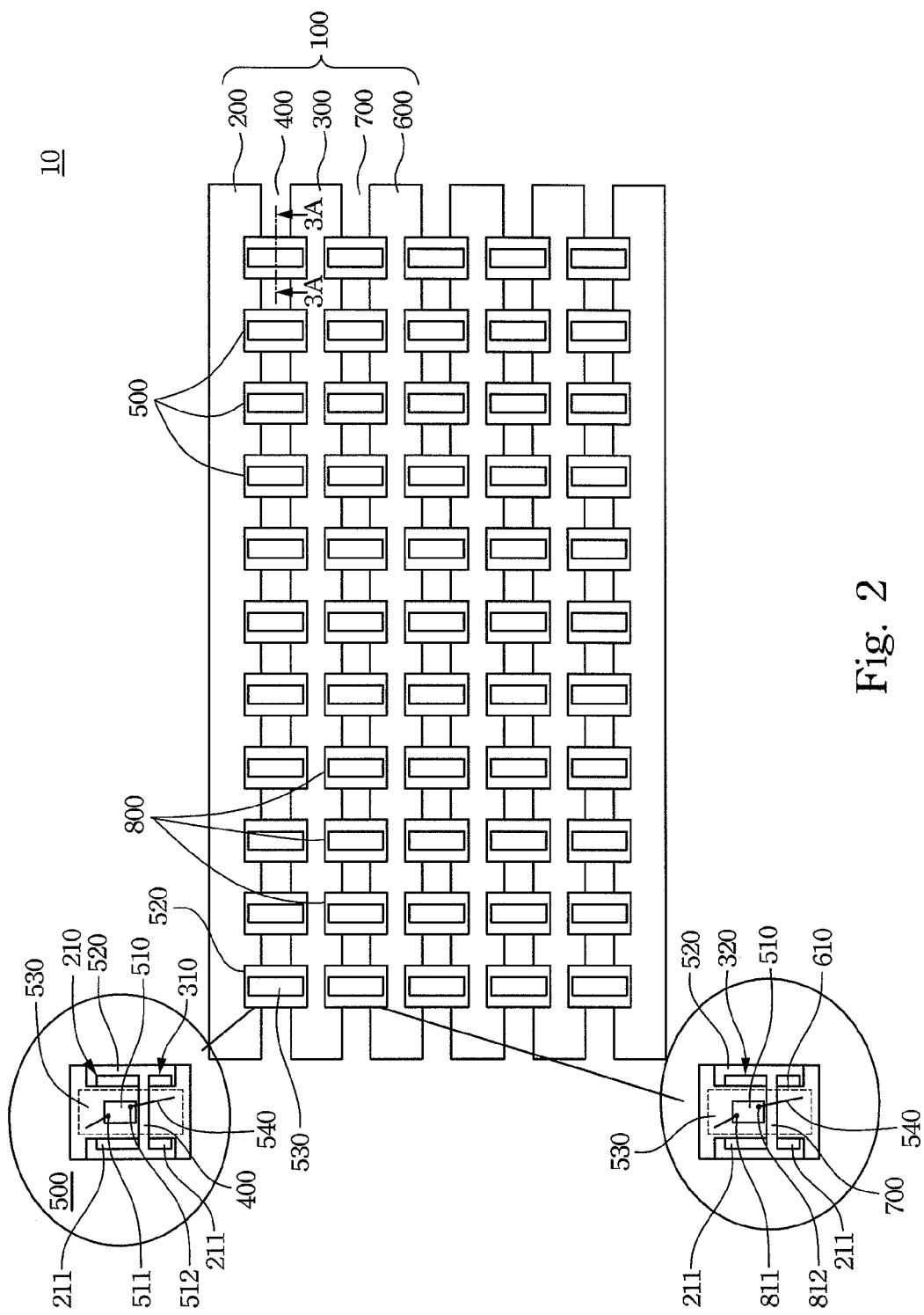
FIG. 2 is a schematic view showing the light device with multiple LED light sources according to one embodiment of the present invention.

FIG. 2 is a schematic view showing the light device 10 with multiple LED light sources according to one embodiment of the present invention. FIG. 3A is a cross sectional view taken alone line 3A-3A of FIG. 2. In one embodiment according to the present invention, the metal conductive plate 100 (which is an electrically-conductive metal such as copper or nickel) at least includes a first plate member 200, a second plate member 300 and a first slot 400. The first slot 400 is defined between the first plate member 200 and the second plate member 300, and served to physically separate the first plate member 200 and the second plate member 300 to avoid a contact between the first plate member 200 and the second plate member 300. The first plate member 200 is installed with a plurality of first chip racks 210 arranged at one lateral side of the first plate member 200 at an equal interval, and the first chip racks 210 are extended towards the first slot 400. Since the electrical conduction property of the first plate member 200, the first chip racks 210 are electrically connected with each other.

As one of alternative embodiments, the first chip racks 210 are not limited to whether being integrally formed with the first plate member 200. When each first chip rack 210 is integrally formed with the first plate member 200, each first chip rack 210 is respectively and electrically connected to the first plate member 200. When each chip rack 210 is not integrally formed with the first plate member 200, the material of each first chip rack 210 is electrically conductive to the first plate member 200.

The second plate member 300 is installed with a plurality of first connection portions 310 arranged at one lateral side of the second plate member 300 at an equal interval, and the first connection portions 310 are extended towards the first slot 400. The first connection portions 310 respectively correspond to the first chip racks 210 one on one. Moreover, the first connection portions 310 are electrically connected with each other through the second plate member 300 because of the electrical conduction property of the second plate member 300.

What shall be noted is that the first slot 400 exits between the first connection portion 310 and the corresponding first chip rack 210, in other words the first connection portion 310 is not in physical contact with the first chip rack 210.

As one of alternative embodiments, the first connection portions 310 are not limited to whether being integrally formed with the second plate member 300. When each first connection portion 310 is integrally formed with the second plate member 300, each first connection portions 310 is respectively and electrically connected to the second plate member 200. When each first connection portion 310 is not integrally formed with the second plate member 300, the material of each first connection portion 310 is electrically conducted to the second plate member 300.

Some of the LED elements for example can be named as first LED elements 500 which are respectively arranged on the first slot 400. Each first LED element 500 has a LED chip 510, a bottom package portion 520 and an upper package portion 530. Each LED chip 510 is respectively placed on one of the first chip racks 210, and electrically connected to both the first chip rack 210 and the first connection portion 310 respectively through a wire 540. The bottom package portion 520 envelops both of the first chip rack 210 and the first connection portion 310, so as to integrate the first chip rack 210 and the first connection portion 310 for avoiding separation. The upper package portion 530 covers the LED chip 510 in the bottom package portion 520 for protecting the electrical connections between the wires 540 and the first chip rack 210, and the wires 540 and the first connection portion 310.

FIG. 3B is a schematic cross sectional view showing the light device 10 with multiple LED light sources according to another embodiment of the present invention. The LED element, for example, the first LED element 500 is further installed with a lens 531. The lens 531 covers on top of the upper package portion 530 and the bottom package portion 520, and is especially aimed at the LED chip 510 in the upper package portion 530. So when the LED chip 510 of the first LED element 500 illuminates light, the lens 531 can provide more light output angles for expanding the output range of the LED element.

The shape of the lens 531 can be dome or semi-sphere, and the material thereof can be epoxy, silicon, a mixture containing both of epoxy and silicon, amorphous polyamide resin, plastic or glass.

Besides, FIG. 3C is a schematic front view showing single LED element of the light device 10 with multiple LED light sources according to still one another embodiment of the present invention. FIG. 3D is a cross sectional view taken along line 3D-31) of FIG. 3C. The upper package portion 530 itself of the LED element 502 can have be a lens; that is the top of the upper package portion 530 is with a lens portion 532 protruding out of the bottom package portion 520 and aims at the LED chip 510. So when the LED chip 510 of the first LED element 500 illuminates light, the lens portion 532 can provide more light output angles for expanding the output range of the LED element.

The shape of the upper package portion 530 can be dome or semi-sphere, and the material thereof can be epoxy, silicon, a mixture containing both of epoxy and silicon, amorphous polyamide resin, plastic or glass.

Figure 4:
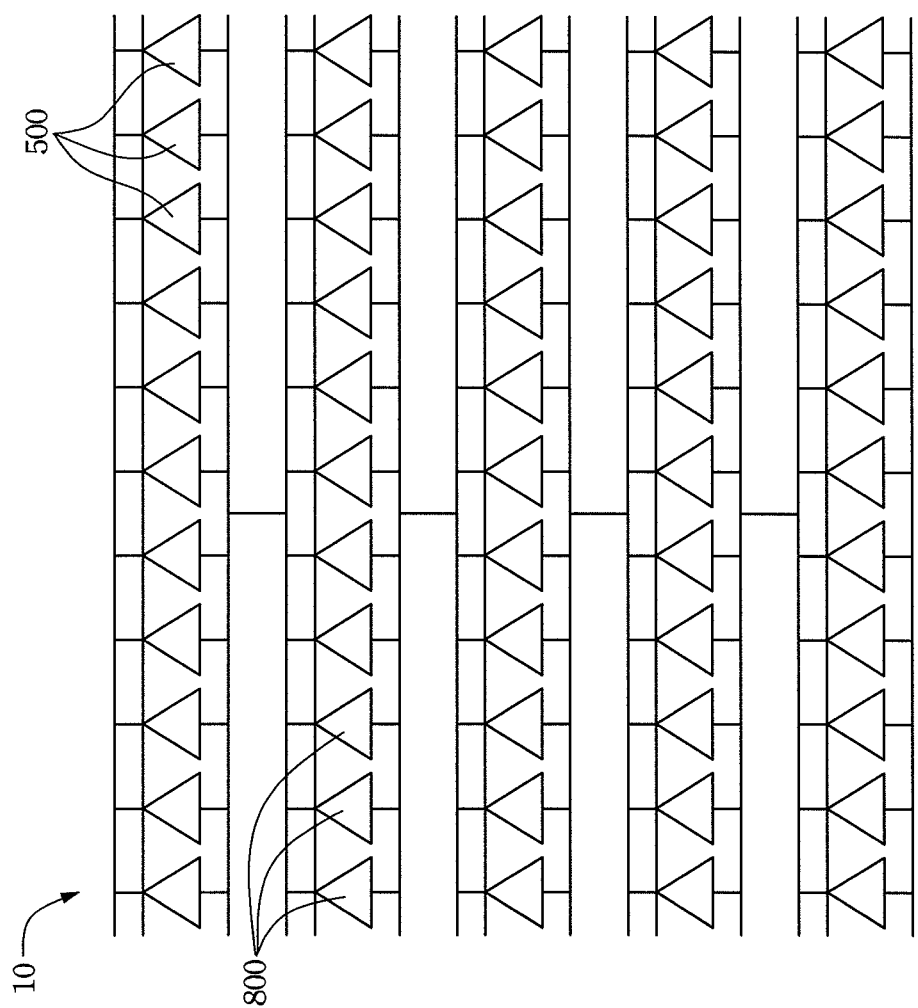
FIG. 4 is a circuit diagram of FIG. 2.

Referring to FIG. 2 and FIG. 4, FIG. 4 is a circuit diagram of FIG. 2. Substantially, the first LED elements 500 are respectively provided with a first electrode 511 and a second electrode 512 having opposite polarities with first electrode 511. The first electrodes 511 are respectively and electrically connected to the first chip racks 210 corresponding to the first LED elements 500. The second electrodes 512 are respectively and electrically connected to the first connection portions 310 corresponding to the first LED elements 500. As such, the first LED elements 500 are electrically connected in parallel.

Referring to FIG. 2, the metal conductive plate 100 can be further provided with a third plate member 600, and a second slot 700. Some of the LED elements for example, are called as a plurality of second LED elements 800.

The third plate member 600 is disposed abreast at one side of the second plate member 300, and the second slot 700 exists between the third plate member 600 and the second plate member 300 and served to separate the third plate member 600 and the second plate member 300 so as to avoid the physical contact between the third plate member 600 and the second plate member 300.

The third plate member 600 is provided with a plurality of second connection portions 610 arranged at one lateral side of the third plate member 600 at an equal interval, and extended towards the second slot 700. The second connection portions 610 are electrically conducted each other because of the electrical conduction property of the third plate member 600. As an alternative, the second connection portions 610 are not limited to whether being integrally formed with the third plate member 600.

One side of the second plate member 300, corresponding to the first connection portions 310, includes a plurality of second chip racks 320. The second chip racks 320 are respectively arranged at the other side of the second plate member 300 at an equal interval, and extended towards the second slot 700, and the second chip racks 320 respectively correspond to the second connection portions 610. Moreover, the second chip racks 320 are electrically connected with each other through the electrical conduction property of the second plate member 300. As an alternative, the second chip racks 320 are not limited to whether being integrally formed with the third plate member 600.

What shall be noted is that the second slot 700 is disposed between the second connection portions 610 and the corresponding second chip racks 320, in other words the second connection portions 610 are not in physical contact with the second chip racks 320.

The second LED elements 800 are linearly arranged on the second slot 700, and each second LED element 800 has a LED chip 510, a bottom package portion 520 and an upper package portion 530. The LED chips 510 are respectively installed on one of the second chip racks 320, and respectively and electrically connected to the second chip racks 320 and the second connection portions 610 through a wire 540. The bottom package portion 520 envelops both of the second chip rack 320 and the second connection portion 610, so as to integrate the second chip rack 320 and the second connection portion 610. The upper package portion 530 covers the LED chip 510 for protecting the electrical connection between the wires 540 and the second chip rack 320 and the second connection portion 610.

Referring to FIG. 2 and FIG. 4, substantially, the second LED elements 800 respectively have a third electrode 811 and a fourth electrode 812 which are opposite in polarities. The third electrodes 811 are respectively and electrically connected to the second chip racks 320 corresponding to the second LED elements 800. The fourth electrodes 812 are respectively and electrically connected to the second connection portions 610 corresponding to the second LED elements 800, wherein the third electrode 811 and the second electrode 512 which are opposite in polarities, i.e. when the first electrode 511 is a positive electrode, the second electrode 512 is a negative electrode 512, at this moment, the third electrode 811 is a positive electrode and the fourth electrode 812 is a negative electrode. As such, any first LED element 500 and any second LED element 800 are electrically connected in series.

Figure 5:
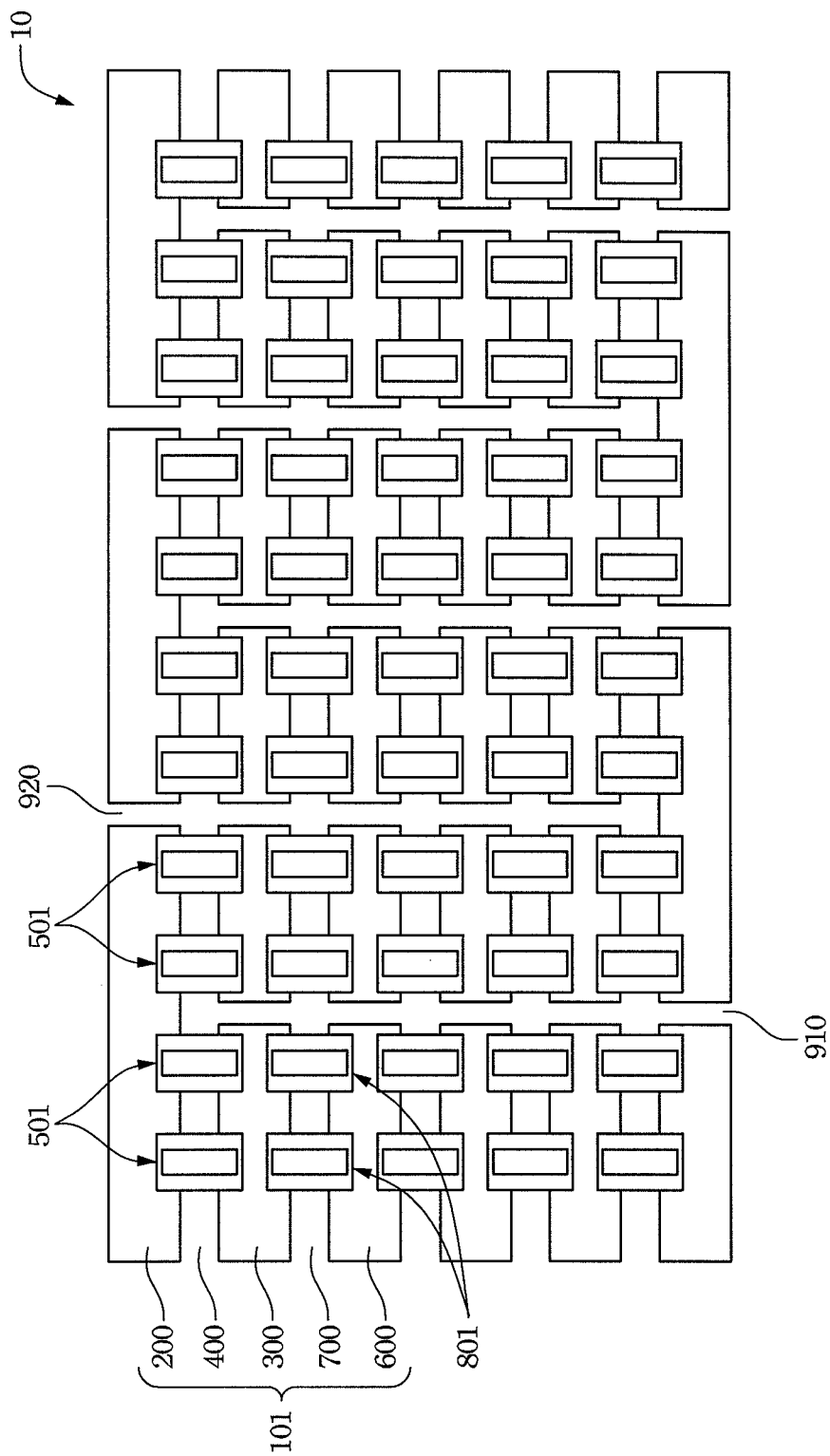
FIG. 5 is a schematic view showing the light device with multiple LED light sources according to another embodiment of the present invention.

FIG. 5 is a schematic view showing the light device 10 with multiple LED light sources according to still one another embodiment of the present invention. In the still one another embodiment according to the present invention, when cutting a metal conductive plate 101 (which is an electrical conductive metal such as copper or nickel) towards the first slot 400 and/or the second slot 700, at least a first elongated notch 910, vertically crossing the first slot 400 and/or the second slot 700, is obtained, The present invention is not limited to the vertical crossing feature, The first elongated notch 910 breaks through the second plate member 300, and communicates with the first slot 400, so the second plate member 300, which has been cut into two pieces, cannot provide the electrical connection to the first connection portions 310 (referring to FIG. 2) disposed along two side of the first elongated notch 910. Moreover, the first elongated notch 910 can further breaks through both of the second plate member 300 and the third plate member 600, and communicates with the second slots 700, so the third plate member 600, which has been cut into two pieces, cannot provide the electrical connection to the second LED) elements 801.

Figure 6:
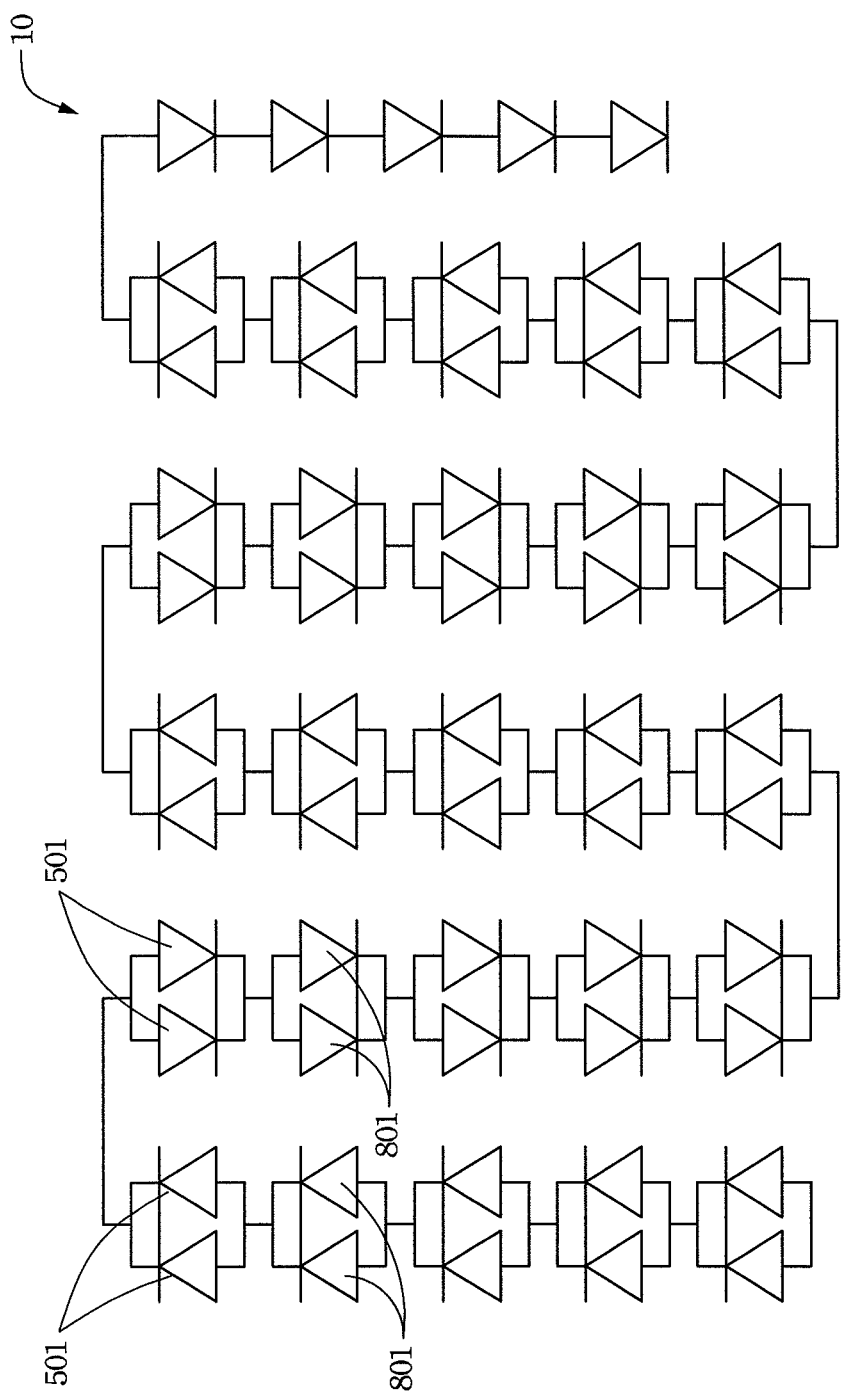
FIG. 6 is a circuit diagram of FIG. 5.

As such, the first LED elements 501 disposed at two sides of the cut second plate member 300 are electrically connected in series (referring to FIG. 6, which is a circuit diagram of FIG. 5).

Referring to FIG. 5, in the still one another embodiment according to the present invention, when cutting the metal conductive plate 101 towards the first slot 400 and/or the second slot 700, at least a second elongated notch 920, vertically crossing the first slot 400 and/or the second slot 700, is obtained. The present invention is not limited to the vertical crossing feature. The second elongated notch 920 breaks through the first plate member 200 and communicates with the first slot 400, so the first plate member 200, which has been cut into two pieces, cannot provide the electrical connection to the first chip racks 210 (referring to FIG. 2) disposed along two side of the second elongated notch 920. Moreover, the second elongated notch 920 can further breaks through both of the first plate member 200 and the second plate member 300, and communicates with the second slots 700, so the second plate member 300, which has been cut into two pieces, cannot provide the electrical connection to the second LED elements 801.

As such, the second LED elements 801 disposed at two sides of the cut second plate member 300 are electrically connected in series (referring to FIG. 6, which is an electric circuit diagram of FIG. 5).

Moreover, in another embodiment as shown in FIG. 3A, the mentioned first chip rack 210 (or the second chip rack) can be provided with two protruding fins 211 and a recess 212. The protruding fins 211 are installed on the first plate member 200 (or the second plate member), and extended towards a same direction, for fastening the bottom package portion 520. The recess 212 is defined between the protruding fins 211 for receiving the LED chip 510. The upper package portion 530 is received in the recess 212 (i.e. the bottom package portion 520) and covers the LED chip 510. The upper package portion 530 is capable of flattening the recess 212 (not shown) or is within the volume of the recess 212 (as shown in FIG. 3A).

The mentioned first connection portion 310 (or the second connection portion 610) includes two protruding fins 611 extended towards the same direction for fastening the bottom package portion 520.

Referring to FIG. 3D, which shows another alternative of the first chip rack 210, the protruding fin 211 has an inclined reflection surface for reflecting the light illuminated by the LED chip 510 to the exterior, so as to provide more light output.

Moreover, referring to FIG. 7, in the still one another embodiment, a second plate member 301 is installed between a first plate member 201 and a third plate member 601 of a metal conductive plate 102 (which is an electrical conductive metal such as copper and nickel). The second plate member 301 is disposed between the first plate member 201 and the third plate member 601, and a first slot 401 is defined between the second plate member 301 and the first plate member 201, a second slot 701 exists between the second plate member 301 and the third plate member 601. The first slot 401 separates the first plate member 201 and the second plate member 301 so as to avoid the physical contact between the first plate member 201 and the second plate member 301. The second slot 701 separates the second plate member 301 and the third plate member 601 so as to avoid the physical contact between the second plate member 301 and the third plate member 601.

Some of the LED elements, for example, are named as third LED elements 900. The third LED elements 900 are respectively arranged on the second plate member 301, electrically insulated to the second plate member 301 but in physical contact with the second plate member 301, such that heat generated by the third LED elements 900 can be dissipated from the second plate member 301.

Each third LED element 900 has a LED chip 510, a bottom package portion 520 and an upper package portion 530. The LED chip 510 is placed on a chip rack (not shown) of the second plate member 301, and respectively and electrically connected to the first plate member 210 and the third plate member 601 through a wire 540. The bottom package portion 520 envelops the first plate member 201, the second plate member 301 and the third plate member 601, so as to integrate the first plate member 201, the second plate member 301 and the third plate member 601 and separation is avoided. The upper package portion 530 covers the LED chip 510 and the wires 540 on the second plate member 301, for protecting the electrical connection between the wires 540 and the first plate member 201, and the wires 540 and the third plate member 601. As such, the third LED elements 900 can be electrically connected with each other through the first plate member 201 and the third plate member 601.

Through separating the convey paths of electric energy and thermal energy of the third LED elements 900, the third LED elements 900 are provided with independent heat dissipation paths and independent electricity supply paths for providing more stable eclectic energy.

This embodiment can be designed as a multiple rows of the third LED elements 900 (as shown in figures), and the mentioned elongated notches 910, 920 can also be formed on the metal conductive plate 102, such that the third LED elements 900 disposed at two side of the plate member are electrically connected in series.

A manufacturing method of light device with multiple LED light sources according to the present invention comprises the following steps:

(1) Firstly, obtaining a metal conductive plate. The metal conductive plate can be a single-layer plate, and the material thereof can be a high thermal conductive copper plate, aluminum plate, or an alloy plate having high thermal conduction.

(2) Processing a pre-cut operation to the metal conductive plate so as to pre-form the mentioned plate members, and the mentioned slots, chip racks and connection portions are initially formed on the plate members. The step can be carried out by processing the metal conductive plate through a punching mold for forming a shape similar to a lead frame. The sizes of the plate members are not necessary to be the same in size, a skilled person in the art can determine the desired sizes of the plate members according to actual needs, the larger the plate member is, the better heat dissipation effect can be provided.

(3) Fabricating a bottom package portion through processing a plastic molding operation. This step can be performed on the metal conductive plate through a plastic injection mold used in injection molding. Because the protruding fins of the chip racks and the connection portions, the adhesion material of the bottom package portion can tightly hold each protruding fin, so as to enhance the strength of the bottom package portion fastening the metal conductive plate.

(4) Respectively installing LED chips in the recesses of the bottom package portions with a pointy adhering means, and respectively performing a wire bonding operation by an aluminum or gold wire soldering machine for electrically connecting the first electrode of the LED chip to the first chip rack, and connecting the second electrode to the first connection portion.

(5) Processing an adhesive filling operation for forming the upper package portion in the bottom package portion for covering the LED chip and the wires (e.g. aluminum or gold wires) so as to provide a package protection. In this step, the mentioned embodiments can be optionally adopted, for forming integrally an upper package portion with a lens portion 532 (as shown in FIG. 3D), or further installing a lens 531 (as shown in FIG. 3B) on the top package portion.

(6) Cutting two lateral sides of the metal conductive plate with a punching machine, i.e. two corresponding sides of each plate member are both cut synchronously, so each plate member is only fastened through the bottom package portion, and the physical contact between the plate members are no longer exist, for forming the state as shown in FIG. 2.

As such, after the light device with multiple LED light sources is tested, it can be directly charged for illumination, which is different from the conventional LED package module in which LED being separately removed from a lead frame then soldered on a circuit board to finally form a light device with multiple LED elements.

The arrangement of the LED elements of the light device with multiple LED light sources is not limited to the array form shown in the figures of the invention; the LED elements can be arranged on the metal conductive plate 100 in other forms, for example in a concentric form.

When the electric circuit and the LED elements of the light device with multiple LED light sources satisfy the actual needs, itself can be directly used as a light device with multiple LED light sources. In actual operations, the appearance of the light device with multiple LED light sources can be in a streamer state, and is able to be stored with a reeling means.

As such, a manufacturer can take a metal conductive plate having a proper length with respect to the actual needs then cut to carious shapes according to the design, for forming the mentioned elongated notches (referring to the elongate notches 910 or 920 shown in FIG. 5), so as to obtain a light device with multiple LED light sources having electric circuits connected in parallel, in series, or a combination of the above two.

When the LED element is a thermoelectric LED element capable of conducting electricity and dissipating heat, the metal conductive plate 100 can be an electrical conduction media and heat dissipation media at the same time. When the LED element is a thermoelectric separation type LED element having independent heat dissipation pins, the metal conductive plate is only served as an electrical conduction media; and the power of single LED element is 0.03~5W.

What shall be highlighted is that:

(1) The mentioned first LED elements 500, the second LED elements 800 and the third LED elements 900 all belong to the same type of units; the first plate member 201, the second plate member 301 and the third plate member 601 all belong to the same type of units; the first chip racks 210 and the second chip racks 320 both belong to the same type of units; and the first connection portions 310 and the second connection portions 610 both belong to the same type of units; therefore, named with different terms and numeral reference is for a better illustration.

(2) The cutting means is not limited to the mentioned embodiments, a light device with multiple LED light sources in which the electrical circuit being connected in parallel, in series, or a combination of the above two through the concept of adopting the mentioned elongated notches is within the scope of the present invention.

(3) The shapes of plate members of the metal conductive plate are not limited, which can for example be in round, oval shapes or in a streamer state.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A light device with multiple LED light sources, comprising:
   a metal conductive plate, comprising:
   a first plate member;
   a second plate member, wherein a first slot is formed between the first plate member and the second plate member, and the first slot separates the physical contact between the second plate member and the first plate member;
   a plurality of first chip racks arranged on the first plate member, and extended into the first slot, and at least partial of the first chip racks electrically contacted with each other through the first plate member;
   a plurality of first connection portions arranged on the second plate member and extended into the first slot, and at least partial of the first connection portions electrically connected with each other through the second plate member, and respectively aligning to the first chip racks; and
   a third plate member, wherein a second slot defined between the second plate member and the third plate member, and the second slot separates the physical contact between the second plate member and the third plate member;
   a plurality of first LED elements respectively arranged across the first slot, each of the first LED elements is electrically connected to the first plate member and the second plate member, wherein the first LED elements are electrically connected with each other through the first plate member and the second plate member; and a plurality of second I. elements respectively installed across the second slot, and each of the second LED elements electrically connected to the second plate member and the third plate member, wherein the first LED elements and the second LED elements are electrically connected with each other through the second plate member.

2. The light device with multiple LED light sources according to claim 1, wherein the first LED elements are electrically connected in parallel.

3. The light device with multiple LE sources according to claim 1, wherein each of the first LEI) elements comprises:

a LED chip disposed on one of the first chip racks, electrically connected to both the first chip rack and the first connection portion;

a bottom package portion enveloping the first chip rack and the first connection portion therein; and an upper package portion covering the LED chip in the bottom package portion.

4. The light device with multiple LED light sources according to claim 1, wherein the second plate member further comprises:

a plurality of second chip racks arranged on the second plate member and extended to the second slot, and electrically connected with each other through the second plate member; and the third plate member further comprises:

a plurality of second connection portions arranged on the third plate member and extended to the second slot, and at least partial of the second connection portions electrically connected with each other through the third plate member, wherein the second connection portions are respectively corresponding to the second chip racks.

5. The light device with multiple LED light sources according to claim 4, wherein any of the first LED elements and any of the second LED elements are electrically connected in series.

6. The light device with multiple LED light sources according to claim 4, wherein the metal conductive plate further comprises a first elongated notch, and the first elongated notch breaks through the second plate member and communicates with the first slot, for electrically insulating the electrical connection between the first connection portions disposed at two sides of the first elongated notch.

7. The light device with multiple LED light sources according to claim 6, wherein the first elongated notch further breaks through the third plate member and communicates with the second slot, for electrically insulating the electrical connection between the second connection portions disposed at the two sides of the first notch.

8. The light device with multiple LED light sources according to claim 1, wherein the metal conductive plate further comprises a second elongated notch, the second elongated notch breaks through the first plate member and communicates with the first slot, for electrically insulating the electrical connection between the first chip racks disposed at two sides of the second notch.

9. The light device with multiple LED light sources according to claim 8, wherein the second elongated notch further breaks through the second plate member and communicates with the second slot, for electrically insulating the electrical connection between the first connection portions disposed at the two sides of the second notch.

10. The light device with multiple LED light sources according to claim 1, wherein each of the first chip racks is integrally formed with the first plate member.

11. The light device with multiple LED light sources according to claim 3, wherein each of the first chip racks comprises:

two protruding fins extending towards a same direction, and capable of fastening the bottom package portion; and a recess formed between the protruding fins, for placing the LED chips and filling with the bottom package portion.

12. The light device with multiple LED light sources according to claim 4, wherein each of the first connection portions and the second chip racks are respectively and integrally formed with the second plate member.

13. The light device with multiple LED light sources according to claim 4, Wherein each of the second connection portions is integrally formed with the third plate member.

14. The light device with multiple LEI) light sources according to claim 3, wherein the upper package portion is with a lens portion shaped as a dome, and the lens portion protrudes outwards the bottom package portion.

15. The light device with multiple LED light sources according to claim 3, wherein each of the first LED elements further comprises a lens covering the top package portion.

16. A light device with multiple LED light sources, comprising:

a metal single-layer conductive plate including a first plate member, a second plate member and a third plate member, wherein the second plate member is disposed between the first plate member and the third plate member;

a first slot is defined between the first plate member and the second plate member, a second slot is defined between the second plate member and the third plate member; the first slot separates the physical contact between the first plate member and the second plate member, the second slot separates the physical contact between the second plate member and the third plate member; and a plurality of LED elements respectively installed on the second plate member, and electrically insulated to the second plate member, and dissipating heat from the second plate member, each of the LED elements comprises:

a LED chip installed on the chip rack, and respectively and electrically connected to both the first plate member and the third plate member through a wire;

a bottom package portion enveloping the first plate member, the second plate member and the third plate member; and an upper package portion covering the LED chip and the wires in the bottom package portion, wherein the upper package has a dome shaped lens portion protruding out of the bottom package portion, wherein the LED elements are electrically connected with each other through the first plate member and the third plate member.

17. The light device with multiple LED light sources according to claim 16, wherein the second plate member comprises a chip rack thereon.

* * * * *